United States Patent
Cheng et al.

(10) Patent No.: US 11,251,078 B2
(45) Date of Patent: Feb. 15, 2022

(54) FORMATION METHOD OF SEMICONDUCTOR DEVICE WITH FIN STRUCTURES

(71) Applicant: Taiwan Semiconductor Manufacturing Co., Ltd., Hsinchu (TW)

(72) Inventors: Chung-Liang Cheng, Changhua County (TW); Ziwei Fang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 84 days.

(21) Appl. No.: 16/745,769

(22) Filed: Jan. 17, 2020

(65) Prior Publication Data
US 2020/0152513 A1     May 14, 2020

Related U.S. Application Data

(63) Continuation of application No. 16/058,095, filed on Aug. 8, 2018, now Pat. No. 10,541,175.

(60) Provisional application No. 62/697,694, filed on Jul. 13, 2018.

(51) Int. Cl.
*H01L 21/768* (2006.01)
*H01L 21/311* (2006.01)
*H01L 21/285* (2006.01)

(52) U.S. Cl.
CPC .. *H01L 21/76886* (2013.01); *H01L 21/31116* (2013.01); *H01L 21/31122* (2013.01); *H01L 21/76816* (2013.01); *H01L 21/76834* (2013.01); *H01L 21/28525* (2013.01); *H01L 21/28556* (2013.01)

(58) Field of Classification Search
CPC ................................................. H01L 21/76886
See application file for complete search history.

(56) References Cited

U.S. PATENT DOCUMENTS

| | | | |
|---|---|---|---|
| 5,949,092 A * | 9/1999 | Kadosh | ............... H01L 21/8221 257/67 |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |

(Continued)

*Primary Examiner* — William A Harriston
(74) *Attorney, Agent, or Firm* — Birch, Stewart, Kolasch & Birch, LLP

(57) ABSTRACT

A method for forming a semiconductor device structure is provided. The method includes forming a first conductive feature over a semiconductor substrate. The method includes forming an oxygen-absorbing layer on a surface of the first conductive feature. The oxygen-absorbing layer absorbs oxygen from the first conductive feature and becomes an oxygen-containing layer. The method includes removing the oxygen-containing layer to expose the surface originally covered by the oxygen-containing layer. The method includes forming a metal-containing layer on the surface. The method includes forming a second conductive feature on the metal-containing layer.

20 Claims, 5 Drawing Sheets

(56) References Cited

U.S. PATENT DOCUMENTS 9,520,482 B1 12/2016 Chang et al.
9,576,814 B2 2/2017 Wu et al.

\* cited by examiner

FORMATION METHOD OF SEMICONDUCTOR DEVICE WITH FIN STRUCTURES

PRIORITY CLAIM AND CROSS-REFERENCE

This application is a Continuation of U.S. application Ser. No. 16/058,095, filed on Aug. 8, 2018, the entirety of which is incorporated by reference herein. The U.S. application Ser. No. 16/058,095 claims the benefit of U.S. Provisional Application No. 62/697,694, filed on Jul. 13, 2018, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
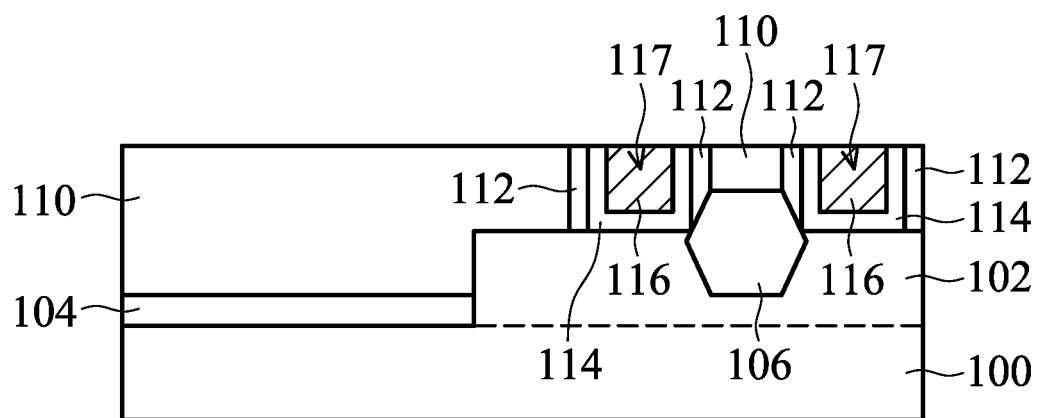
FIGS. 1A-1I are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to FinFET structure having fins. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

FIGS. 1A-1I are cross-sectional views of various stages of a process for forming a semiconductor device structure, in accordance with some embodiments. As shown in FIG. 1A, a semiconductor substrate 100 is provided or received. In some embodiments, the semiconductor substrate 100 is a bulk semiconductor substrate, such as a semiconductor wafer. For example, the semiconductor substrate 100 includes silicon or other elementary semiconductor materials such as germanium. The semiconductor substrate 100 may be un-doped or doped (e.g., p-type, n-type, or a combination thereof).

In some other embodiments, the semiconductor substrate 100 includes a compound semiconductor. The compound semiconductor may include silicon carbide, gallium arsenide, indium arsenide, indium phosphide, one or more other suitable compound semiconductors, or a combination thereof.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 1A, one or more recesses (or trenches) are formed in the semiconductor substrate 100, in accordance with some embodiments. As a result, one or more fin structures are formed or defined between the recesses. In FIG. 1A, one of the fin structures (the fin structure 102) is shown. In some embodiments, one or more photolithography and etching processes are used to form the recesses. In some embodiments, the fin structure 102 is in direct contact with the semiconductor substrate 100.

However, embodiments of the disclosure have many variations and/or modifications. In some other embodiments, the fin structure 102 is not in direct contact with the semiconductor substrate 100. One or more other material layers may be formed between the semiconductor substrate 100 and the fin structure 102. For example, a dielectric layer may be formed between the semiconductor substrate 100 and the fin structure 102.

As shown in FIG. 1A, an isolation feature 104 is formed in the recesses to surround lower portions of the fin structure 102, in accordance with some embodiments. The isolation feature 104 is used to define and electrically isolate various device elements formed in and/or over the semiconductor substrate 100. In some embodiments, the isolation feature 104 includes shallow trench isolation (STI) features, local oxidation of silicon (LOCOS) features, another suitable isolation feature, or a combination thereof.

In some embodiments, the isolation feature 104 has a multi-layer structure. In some embodiments, the isolation feature 104 is made of a dielectric material. The dielectric material may include silicon oxide, silicon nitride, silicon oxynitride, fluoride-doped silicate glass (FSG), low-K dielectric material, one or more other suitable materials, or a combination thereof. In some embodiments, an STI liner (not shown) is formed to reduce crystalline defects at the interface between the semiconductor substrate 100 and the isolation feature 104. Similarly, the STI liner may also be used to reduce crystalline defects at the interface between the isolation feature 104 and the fin structure 102.

In some embodiments, a dielectric material layer is deposited over the semiconductor substrate 100. The dielectric material layer covers the fin structure 102 and fills the recesses between the fin structure 102 and other fin structures. The dielectric material layer may be deposited using a chemical vapor deposition (CVD) process, an atomic layer deposition (ALD) process, a physical vapor deposition (PVD) process, a spin-on process, one or more other applicable processes, or a combination thereof.

In some embodiments, a planarization process is then used to thin down the dielectric material layer until the fin structure 102 or hard mask elements defining the fin structures are exposed. The planarization process may include a chemical mechanical polishing (CMP) process, a grinding process, a dry polishing process, an etching process, one or more other applicable processes, or a combination thereof. Afterwards, the dielectric material layer is etched back such that the fin structure 102 protrudes from the top surface of the remaining dielectric material layer after the etching process. As a result, the remaining portions of the dielectric material layer form the isolation feature 104, as shown in FIG. 1A.

Afterwards, dummy gate stacks (not shown) are formed over the semiconductor substrate 100 to partially cover the fin structure 102, in accordance with some embodiments. The dummy gate stacks include a gate electrode and a gate dielectric layer. In some embodiments, a gate dielectric material layer and a gate electrode material layer are deposited over the isolation feature 104 and the fin structure 102. Afterwards, the gate dielectric material layer and the gate electrode material layer are patterned to form the dummy gate stacks.

In some embodiments, spacer elements 112 are formed over sidewalls of the dummy gate stacks. The spacer elements 112 may be used to assist in the formation of source and drain structures (or regions) in subsequent processes. In some embodiments, the spacer elements 112 are made of or include silicon nitride, silicon oxynitride, silicon carbide, silicon carbon oxynitride, one or more other suitable materials, or a combination thereof.

In some embodiments, a spacer layer is deposited over the semiconductor substrate 100, the fin structure 102, and the dummy gate stacks. The spacer layer may be deposited using a CVD process, an ALD process, a PVD process, a spin-on process, one or more other applicable processes, or a combination thereof. Afterwards, an etching process, such as an anisotropic etching process, is performed to partially remove the spacer layer. As a result, the remaining portions of the spacer layer over the sidewalls of the dummy gate stacks form the spacer elements 112.

Afterwards, the fin structure 102 is partially removed to form recesses, in accordance with some embodiments. In some embodiments, the fin structure 102 is recessed to a level below the top surfaces of the isolation feature 104. In some embodiments, an etching process is used to form the recesses 114.

Many variations and/or modifications can be made to embodiments of the disclosure. In some other embodiments, the fin structure 102 is not recessed. In some other embodiments, the fin structure 102 is merely thinned without being recessed to a level below the top surfaces of the isolation feature 104.

Afterwards, one or more semiconductor materials are epitaxially grown over the fin structure 102 to fill the recesses, in accordance with some embodiments. As a result, one or more epitaxial structures are formed. In FIG. 1A, one of the epitaxial structures (the epitaxial structure 106) is shown. The epitaxial structure 106 may function as a source or drain structure. The epitaxial structure 106 may also function as a stressor to improve carrier mobility.

In some embodiments, the epitaxial structure 106 is made of one or more p-type semiconductor materials. For example, the epitaxial structure 106 may include epitaxially grown silicon germanium, germanium, one or more other suitable materials, or a combination thereof. In some other embodiments, the epitaxial structure 106 is made of one or more n-type semiconductor materials. The epitaxial structure 106 may include epitaxially grown silicon, epitaxially grown silicon carbide (SiC), or another suitable epitaxially grown semiconductor material.

In some embodiments, the epitaxial structure 106 is formed using a selective epitaxy growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, an ALD process, one or more other applicable processes, or a combination thereof. The formation process of the epitaxial structure 106 may use gaseous and/or liquid precursors.

In some embodiments, the epitaxial structure 106 includes dopants. For example, the epitaxial structure 106 is p-type doped, and the dopants may include boron, gallium, one or more other suitable dopants, or a combination thereof. The epitaxial structure 106 may also be n-type doped, and the dopants may include phosphor. In some embodiments, the epitaxial structure 106 is doped in-situ during the growth of the epitaxial structure 106. In some other embodiments, the epitaxial structure 106 is not doped during the growth of the epitaxial structure 106. In some embodiments, one or more implantation processes are used to dope the epitaxial structure 106. After the epitaxial growth, the epitaxial structure 106 is doped in a subsequent process.

In some embodiments, the doping is achieved using an ion implantation process, a plasma immersion ion implantation process, a gas and/or solid source diffusion process, one or more other applicable processes, or a combination thereof. In some embodiments, the epitaxial structure 106 is further exposed to one or more annealing processes to activate the dopants. For example, a rapid thermal annealing process is used.

In some embodiments, a dielectric material layer is deposited over the epitaxial structure 106, the isolation feature 104, and the dummy gate stacks. The dielectric material layer may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable dielectric materials, or a combination thereof. In some embodiments, the dielectric material layer is deposited using a CVD process, an ALD process, a PVD process, a spin-on process, one or more other applicable processes, or a combination thereof.

Afterwards, the dielectric material layer is thinned until the dummy gate stacks are exposed. The dielectric material layer may be thinned until the hard mask elements used for defining the dummy gate stacks are exposed. Alternatively, the dielectric material layer may be thinned until the dummy gate stacks are exposed. After the thinning process of the dielectric material layer, the remaining portion of the dielectric material layer forms the dielectric layer 110, as shown in FIG. 1A. The dielectric layer 110 covers the epitaxial structure 106 and surrounds the dummy gate stacks.

Afterwards, a gate replacement process may be performed. The dummy gate stacks are removed to form trenches. Then, metal gate stacks 117 are formed in the trench. Each of the metal gate stacks 117 may include a high-k gate dielectric layer 114 and a metal electrode 116. The metal electrode 116 may include a work function layer and a metal filling surrounded by the work function layer.

Figure 1B:
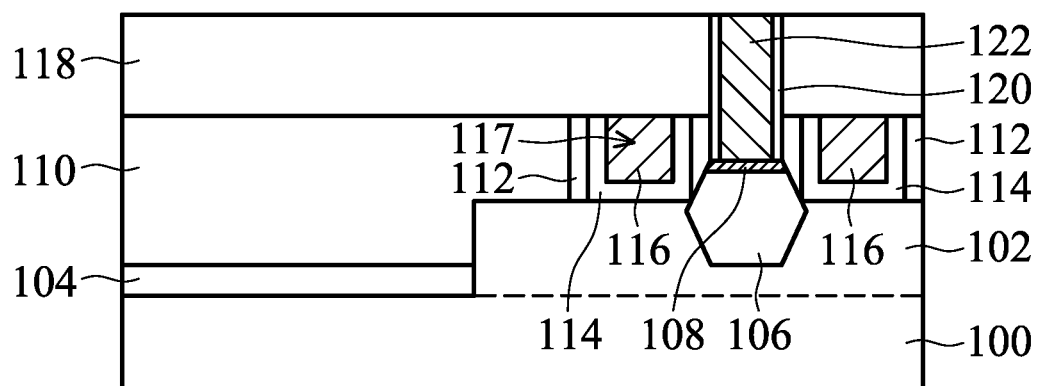

As shown in FIG. 1B, a dielectric layer 118 is deposited over the dielectric layer 110 and the metal gate stacks 117, in accordance with some embodiments. The material and formation method of the dielectric layer 110 may be the same as or similar to those of the dielectric layer 104.

Afterwards, the dielectric layers 110 and 118 are partially removed to form a contact opening that exposes the epitaxial structure 106, in accordance with some embodiments. The contact opening may be formed using a photolithography process and an etching process.

As shown in FIG. 1B, a metal-semiconductor compound region 108 is formed, in accordance with some embodiments. The metal-semiconductor region may help to reduce resistance between the epitaxial structure 106 and a conductive contact to be formed over the epitaxial structure 106. The metal-semiconductor compound region 108 may be made of or include metal silicide material, a silicon-germanium-metal-containing material, a germanium-metal-containing material, or a combination thereof.

In some embodiments, a surface portion of the epitaxial structure 106 is modified to have lower crystallinity than an inner portion of the epitaxial structure 106. The lower crystallinity of the surface portion may facilitate the subsequent formation of the metal-semiconductor region 108. The surface portion may be modified using an ion implantation process.

Afterwards, a metal-containing material is applied (or deposited) on the epitaxial structure 106 while the epitaxial structure 106 is heated, in accordance with some embodiments. Because the metal-containing material is applied during the heating of the epitaxial structure, the thermal energy may help to initiate chemical reaction between the surface portion of the epitaxial structure 106 and the metal-containing material. As a result, a surface portion of the epitaxial structure 106 reacts with the metal-containing material and is transformed into the metal-semiconductor compound region 108.

Afterwards, a barrier layer 120 and a conductive contact 122 are formed in the contact opening, as shown in FIG. 1B in accordance with some embodiments. The barrier layer 120 may be made of or include titanium nitride, cobalt nitride, tantalum nitride, one or more other suitable materials, or a combination thereof. The conductive contact 122 may be made of or include cobalt, ruthenium, titanium, tungsten, molybdenum, one or more other suitable materials, or a combination thereof. The formation of the barrier layer 120 and the conductive contact 122 may involve a CVD process, an ALD process, one or more other applicable processes, or a combination thereof. A planarization process may also be used to assist in the formation of the barrier layer 120 and the conductive contact 122. The planarization process may include a CMP process, a grinding process, an etching process, a dry polishing process, one or more other applicable processes, or a combination thereof.

Figure 1C:
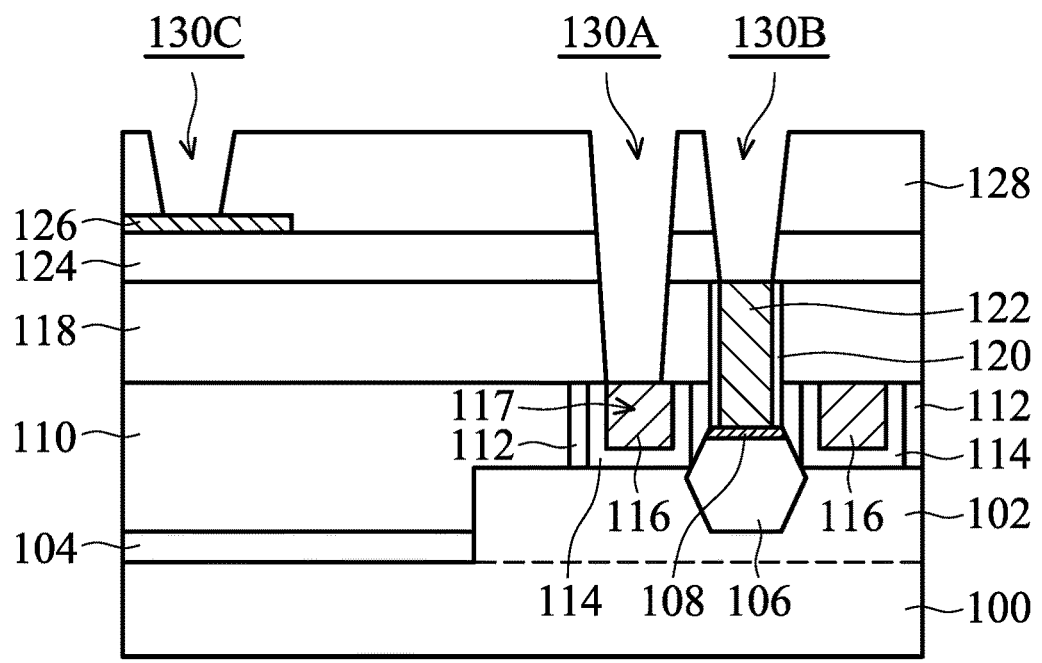

As shown in FIG. 1C, an etch stop layer 124 is deposited over the dielectric layer 118 and the conductive contact 122, in accordance with some embodiments. The etch stop layer 124 may be made of or include silicon nitride, silicon oxynitride, silicon carbide, silicon oxycarbide, aluminum oxide, one or more other suitable materials, or a combination thereof. The etch stop layer 124 may be deposited using a CVD process, an ALD process, a PVD process, one or more other applicable processes, or a combination thereof.

However, many variations and/or modifications can be made to embodiments of the disclosure. In some other embodiments, the etch stop layer 124 is not formed.

As shown in FIG. 1C, a resistive layer 126 is formed over the etch stop layer 124, in accordance with some embodiments. The resistive layer 126 may be a portion of a passive element such as a resistor. The resistive layer 126 may be made of or include tantalum nitride, titanium nitride, amorphous silicon, one or more other suitable materials, or a combination thereof. The resistive layer 126 may be deposited using a CVD process, an ALD process, a PVD process, one or more other applicable processes, or a combination thereof.

Afterwards, a dielectric layer 128 is deposited over the etch stop layer 124 and the resistive layer 126, as shown in FIG. 1C in accordance with some embodiments. The material and formation method of the dielectric layer 128 may be the same as or similar to those of the dielectric layer 110.

Afterwards, openings 130A, 130B, and 130C are formed to respectively expose the metal gate stack 117, the conductive contact 122, and the resistive layer 126, as shown in FIG. 1C in accordance with some embodiments. The formation of the openings 130A, 130B, and 130C may involve one or more photolithography processes and one or more etching processes. In some cases, the surfaces of the conductive features exposed by the openings 130A, 130B, and/or 130C may be slightly oxidized, which may increase resistance between the conductive features and subsequently formed conductive structures.

Figure 1D:
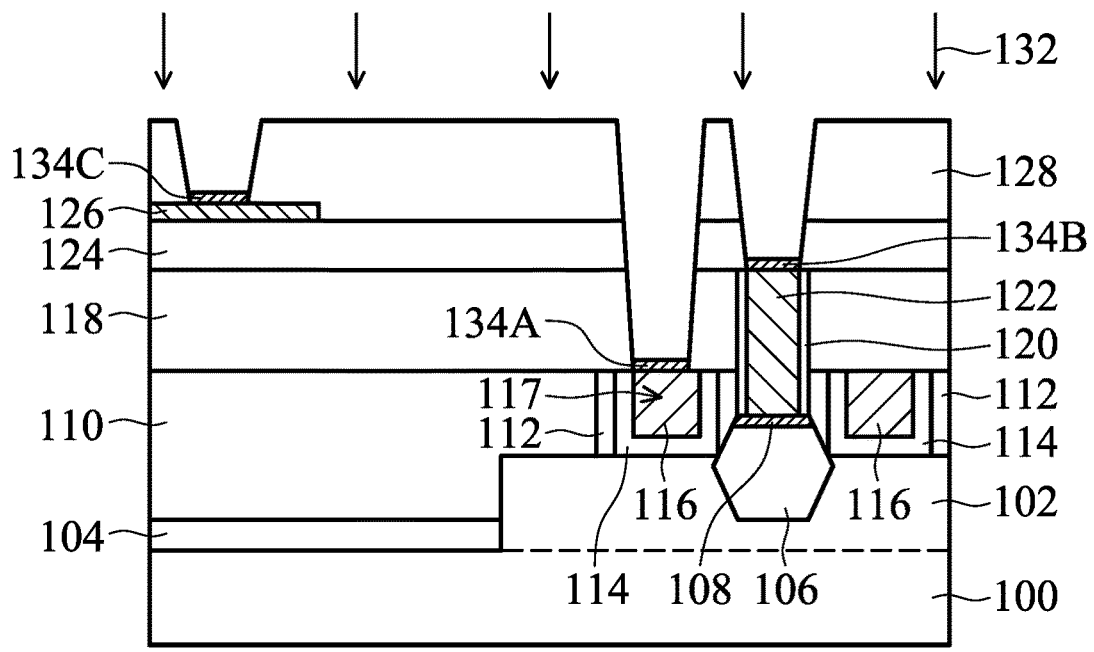

As shown in FIG. 1D, oxygen-absorbing layers 134A, 134B, and 134C are respectively formed on the metal gate stack 117, the conductive contact 122, and the resistive layer 126, in accordance with some embodiments. In some embodiments, the oxygen-absorbing layers 134A, 134B, and 134C are made of or include aluminum. In some embodiments, a modification operation 132 is used to modify the surface quality of the metal gate stack 117, the conductive contact 122, and the resistive layer 126. The modification operation 132 may be used to selectively form the oxygen-absorbing layers 134A, 134B, and 134C on the metal gate stack 117, the conductive contact 122, and the resistive layer 126, respectively.

In some embodiments, the oxygen-absorbing layers 134A, 134B, and 134C are formed using an aluminum-containing precursor. The aluminum-containing precursor may be made of or include triethylaluminum, dimethylaluminumhydride, trimethylaluminum, dimethylethylamine alane, one or more other suitable precursors, or a combination thereof. In some embodiments, the aluminum-containing precursor is applied or provided on the conductive feature(s) including the metal gate stack 117, the conductive contact 122, and the resistive layer 126 to form aluminum-containing layers. The aluminum-containing layers may be made of aluminum. The aluminum-containing layer may have a thickness that is in a range from about 5 Å to about 10 Å.

In some embodiments, the aluminum-containing precursor is applied using a CVD process. The aluminum-containing layers may be selectively formed on surfaces of metal elements. The operation temperature may be in a range from about 250 degrees C. to about 550 degrees C. The operation pressure may be in a range from about 0.5 torrs to about 5 torrs. The operation time may be in a range from about 30 seconds to about 120 seconds. The deposition conditions (such as the operation time) may be used to control the thickness of the oxygen-absorbing layers 134A, 134B, and 134C.

As mentioned earlier, the surfaces of the conductive features exposed by the openings 130A, 130B, and/or 130C may be slightly oxidized. The oxygen-absorbing layers 134A, 134B, and 134C may absorb oxygen from the conductive features including the metal gate stack 117, the conductive contact 122, and the resistive layer 126 and becomes oxygen-containing layers. The conductive features may therefore have better conductivity since the oxidized portions are reduced to metal states.

Figure 1E:
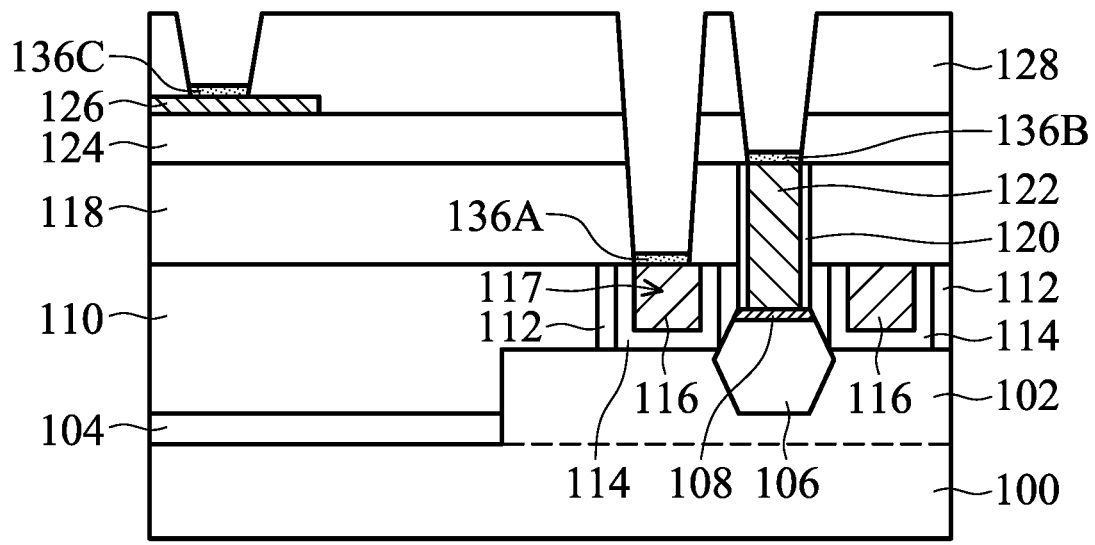

As shown in FIG. 1E, once the oxygen-absorbing layers 134A, 134B, and 134C are deposited on the metal gate stack 117, the conductive contact 122, and the resistive layer 126, the oxygen-absorbing layers 134A, 134B, and 134C may soon absorb oxygen from the surface portions of the metal gate stack 117, the conductive contact 122, and the resistive layer 126. As a result, oxygen-containing layers 136A, 136B, and 136C are formed, as shown in FIG. 1E in accordance with some embodiments. In some embodiments, the oxygen-containing layers 136A, 136B, and 136C are made of or include aluminum oxide.

In some other embodiments, oxygen-absorbing layers 134A, 134B, and 134C are made of or include silicon. A silicon-containing precursor (such as silane) may be used to form thin silicon films on the metal gate stack 117, the conductive contact 122, and the resistive layer 126. The silicon layers may also act as oxygen-absorbing layers to form the oxygen-containing layers 136A, 136B, and 136C as shown in FIG. 1E. In these cases, the oxygen-containing layers 136A, 136B, and 136C are made of or include silicon oxide.

Figure 1F:
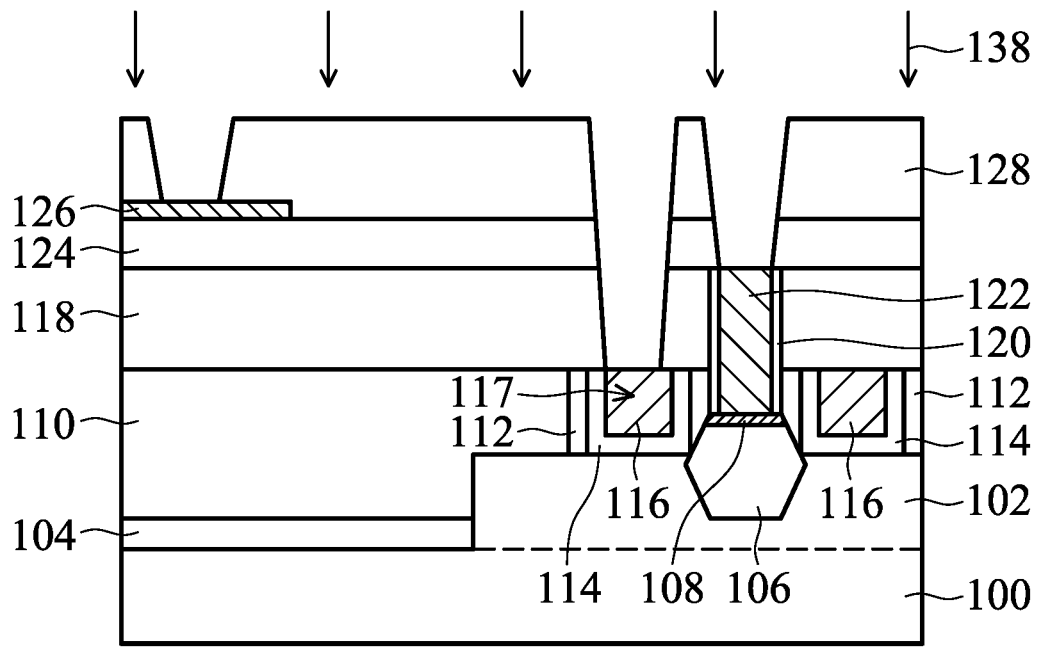
Figure 1G:
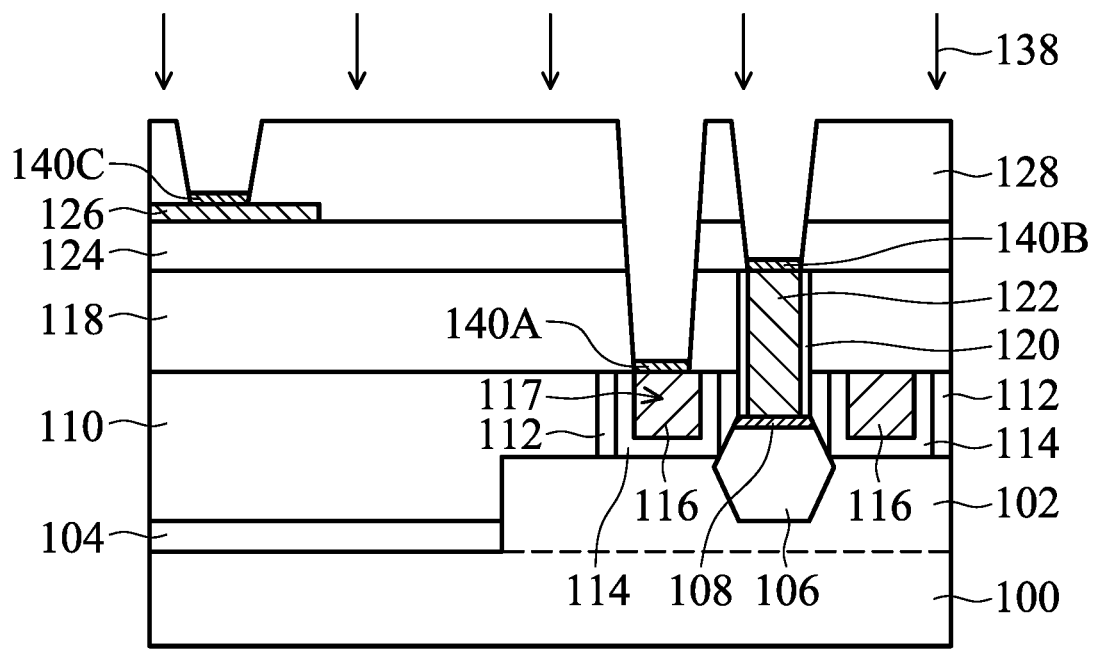

As shown in FIG. 1F, a modification operation 138 is used to provide a metal-containing precursor on the oxygen-containing layers 136A, 136B, and 136C, in accordance with some embodiments. The metal-containing precursor is capable of removing the entire oxygen-containing layers 136A, 136B, and 136C. After the removal of the entire oxygen-containing layers 136A, 136B, and 136C, the provided metal-containing precursor continues to respectively and selectively form metal-containing layer 140A, 140B, and 140C on the metal gate stack 117, the conductive contact 122, and the resistive layer 126, as shown in FIG. 1G in accordance with some embodiments.

In some embodiments, the metal-containing precursor includes a tungsten-containing precursor. The tungsten-containing precursor may include $WCl_5$, and the metal-containing layer 140A, 140B, and 140C may be made of or include tungsten. In some embodiments, the metal-containing precursor is substantially fluorine free. Because the metal-containing precursor is substantially fluorine free, the device elements thereunder may be prevented from being negatively affected by fluorine. In some embodiments, the metal-containing precursor is selectively applied on the metal gate stack 117, the conductive contact 122, and the resistive layer 126 using an atomic layer deposition (ALD) process.

In some embodiments, the operation temperature of the ALD process is in a range from about 300 degrees C. to about 550 degrees C. The operation pressure may be in a range from about 15 torrs to about 40 torrs. Each of the metal-containing layers 140A, 140B, and 140C may have a thickness that is in a range from about 10 Å to about 50 Å. In some embodiments, the cycle number of the ALD process may be adjusted to control the thicknesses of the metal-containing layers 140A, 140B, and 140C.

In some other embodiments, the metal-containing precursor includes $TaCl_5$, $MoCl_5$, or a combination thereof. In these cases, the metal-containing layers 140A, 140B, and 140C may be made of or include Ta or Mo. In some other embodiments, another precursor such as $BCl_3$ may be used to replace the metal-containing precursor.

The metal-containing precursor may act as an etching gas to remove the oxygen-containing layers 136A, 136B, and 136C. The metal-containing precursor may also act as a selective metal growth precursor to form a metal layer (or metal protection layer) on the conductive features including the metal gate stack 117, the conductive contact 122, and the resistive layer 126.

Figure 1H:
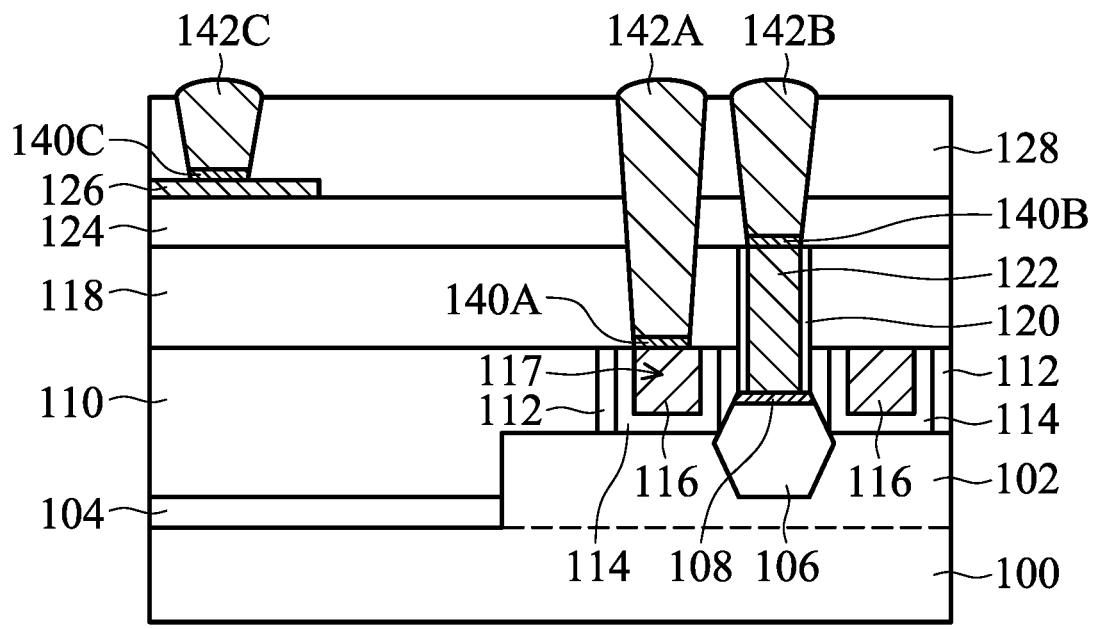

As shown in FIG. 1H, conductive features 142A, 142B, and 142C are respectively formed on the metal-containing layers 140A, 140B, and 140C, in accordance with some embodiments. Each of the conductive features 142A, 142B, and 142C may be made of or include ruthenium, cobalt, tungsten, molybdenum one or more other suitable materials, or a combination thereof. In some embodiments, the conductive features 142A, 142B, and 142C are selectively grown on the metal-containing layers 140A, 140B, and 140C, respectively.

In some embodiments, a CVD process is used to form the conductive features 142A, 142B, and 142C. The operation temperature may be in a range from about 250 degrees C. to about 300 degrees C. The operation pressure may be in a range from about 5 torrs to about 15 torrs. The reaction gas used for forming the conductive features 142A, 142B, and 142C may include $WF_6$, $C_5H_5(CO)_2Co$, $Ru_3(CO)_{12}$, one or more other suitable precursors, or a combination thereof. In some embodiments, H$_2$ and/or Ar are also used. The thickness of the conductive features 142A, 142B, and 142C may be in a range from about 300 Å to about 1500 Å, which may be controlled by the operation time.

Figure 1I:
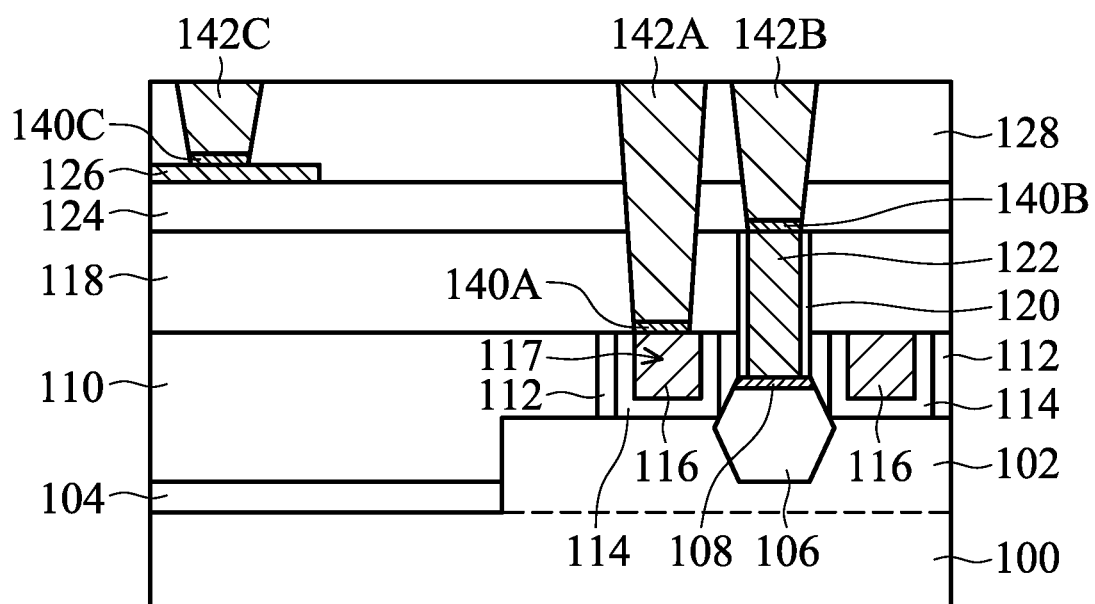

As shown in FIG. 1I, a planarization process is used to provide the conductive features 142A, 142B, and 142C with substantially planar top surfaces, in accordance with some embodiments. The planarization process may include a chemical mechanical polishing (CMP) process, a dry polishing process, an etching process, a grinding process, one or more other applicable processes, or a combination thereof. The top surfaces of the conductive features 142A, 142B, and 142C may be substantially coplanar with the top surface of the dielectric layer 128.

In some embodiments, the metal-containing layers 140A, 140B, and 140C include a trace amount of atoms from the oxygen-containing layers 136A, 136B, and 136C. In some embodiments, the metal-containing layers 140A, 140B, and 140C include aluminum residue. In these cases, a trace amount of aluminum may be detected in the metal-containing layers 140A, 140B, and 140C.

In some embodiments, the modification operation 132 illustrated in FIG. 1D, the modification operation 138 illustrated in FIGS. 1F and 1G, and the formation of the conductive features illustrated in FIG. 1H are in-situ performed using the same process tool. The semiconductor device structure is prevented from becoming polluted or damaged. The electrical connection between the conductive features 142A, 142B, and 142C and the conductive features including the metal gate stack 117, the conductive contact 122, and the resistive layer 126 are greatly improved.

Embodiments of the disclosure form an oxygen-absorbing layer over a conductive feature. The oxygen-absorbing layer absorbs oxygen from the conductive feature to form an oxygen-containing layer. Even if the conductive feature may be slightly oxidized, the oxygen is removed by the oxygen-absorbing layer. The conductive feature itself may have improved conductivity. Afterwards, a metal-containing precursor is used to remove the oxygen-containing layer and form a metal layer on the conductive feature to protect the conductive feature thereunder. A second conductive feature is then formed on the metal layer. The electrical connection between the conductive feature and the second conductive feature is greatly improved.

In accordance with some embodiments, a method for forming a semiconductor device structure is provided. The method includes forming a first conductive feature over a semiconductor substrate. The method includes forming an oxygen-absorbing layer on a surface of the first conductive feature. The oxygen-absorbing layer absorbs oxygen from the first conductive feature and becomes an oxygen-containing layer. The method includes removing the oxygen-containing layer to expose the surface originally covered by the oxygen-containing layer. The method includes forming a metal-containing layer on the surface. The method includes forming a second conductive feature on the metal-containing layer.

In accordance with some embodiments, a method for forming a semiconductor device structure is provided. The method includes selectively forming an oxygen-absorbing layer on a surface of a first metal-containing element. The oxygen-absorbing layer absorbs oxygen from the first metal-containing element and becomes an oxygen-containing layer. The method includes removing the entire oxygen-containing layer to expose the surface originally covered by the oxygen-containing layer. The method includes selectively forming a metal-containing layer on the surface. The method includes forming a second metal-containing element on the metal-containing layer.

In accordance with some embodiments, a method for forming a semiconductor device structure is provided. The method includes forming a first metal-containing element over a semiconductor substrate. The method includes forming a metal layer on a surface of the first metal-containing element. The metal layer absorbs oxygen from the first metal-containing element and becomes an oxygen-containing layer. The method includes etching the oxygen-containing layer to expose the surface originally covered by the oxygen-containing layer. The method includes forming a metal-containing layer on the surface. The method includes forming a second metal-containing element on the metal-containing layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a first conductive feature over a semiconductor substrate;
   forming an oxygen-absorbing layer on a surface of the first conductive feature, wherein the oxygen-absorbing layer absorbs oxygen from the first conductive feature and becomes an oxygen-containing layer;
   removing the oxygen-containing layer and exposing the surface originally covered by the oxygen-containing layer;
   forming a metal-containing layer on the surface; and
   forming a second conductive feature on the metal-containing layer.

2. The method for forming a semiconductor device structure as claimed in claim 1, wherein the removing of the oxygen-containing layer comprises:
   applying a metal-containing precursor on the oxygen-containing layer to remove the oxygen-containing layer.

3. The method for forming a semiconductor device structure as claimed in claim 2, wherein the forming of the metal-containing layer on the surface comprises:
   continuing to apply the metal-containing precursor on the surface to form the metal-containing layer on the surface, wherein after removing the oxygen-containing layer, the surface originally covered by the oxygen-containing layer is directly exposed to the metal-containing precursor to form the metal-containing layer on the surface.

4. The method for forming a semiconductor device structure as claimed in claim 1, wherein the first conductive feature is a metal gate stack.

5. The method for forming a semiconductor device structure as claimed in claim 1, wherein the first conductive feature is a conductive contact electrically connected to a source/drain structure.

6. The method for forming a semiconductor device structure as claimed in claim 1, wherein the first conductive feature is a portion of a passive element.

7. The method for forming a semiconductor device structure as claimed in claim 1, wherein the oxygen-absorbing layer comprises an aluminum layer, and the oxygen-containing layer comprises an aluminum oxide layer.

8. The method for forming a semiconductor device structure as claimed in claim 1, wherein the oxygen-absorbing layer comprises a silicon layer, and the oxygen-containing layer comprises a silicon oxide layer.

9. The method for forming a semiconductor device structure as claimed in claim 1, wherein the metal-containing precursor comprises a tungsten-containing precursor.

10. The method for forming a semiconductor device structure as claimed in claim 9, wherein the metal-containing precursor is substantially fluorine free.

11. The method for forming a semiconductor device structure as claimed in claim 1, wherein the metal-containing precursor comprises $WCl_5$, $TaCl_5$, $MoCl_5$, or a combination thereof.

12. A method for forming a semiconductor device structure, comprising:
 selectively forming an oxygen-absorbing layer on a surface of a first metal-containing element, wherein the oxygen-absorbing layer absorbs oxygen from the first metal-containing element and becomes an oxygen-containing layer;
 removing the entire oxygen-containing layer to expose the surface originally covered by the oxygen-containing layer;
 selectively forming a metal-containing layer on the surface; and
 forming a second metal-containing element on the metal-containing layer.

13. The method for forming a semiconductor device structure as claimed in claim 12, wherein the removing of the oxygen-containing layer comprises:
 selectively providing a metal-containing precursor on the oxygen-containing layer to remove the oxygen-containing layer.

14. The method for forming a semiconductor device structure as claimed in claim 13, wherein the selectively forming of the metal-containing layer on the surface comprises:
 continuing selectively providing the metal-containing precursor on the surface to form the metal-containing layer on the surface, wherein after removing the oxygen-containing layer, the surface originally covered by the oxygen-containing layer is directly exposed to the metal-containing precursor to form the metal-containing layer on the surface.

15. The method for forming a semiconductor device structure as claimed in claim 12, further comprising:
 forming a dielectric layer over the first metal-containing element; and
 forming an opening in the dielectric layer to expose the first metal-containing element before selectively forming the oxygen-absorbing layer.

16. The method for forming a semiconductor device structure as claimed in claim 12, wherein the oxygen-absorbing layer is formed using an aluminum-containing precursor.

17. The method for forming a semiconductor device structure as claimed in claim 12, wherein the metal-containing precursor contains tungsten, tantalum, or molybdenum.

18. The method for forming a semiconductor device structure as claimed in claim 12, wherein the metal-containing precursor contains chlorine.

19. A method for forming a semiconductor device structure, comprising:
 forming a first metal-containing element over a semiconductor substrate;
 forming a metal layer on a surface of the first metal-containing element, wherein the metal layer absorbs oxygen from the first metal-containing element and becomes an oxygen-containing layer;
 etching the oxygen-containing layer to expose the surface originally covered by the oxygen-containing layer;
 forming a metal-containing layer on the surface; and
 forming a second metal-containing element on the metal-containing layer.

20. The method for forming a semiconductor device structure as claimed in claim 19, wherein the etching of the oxygen-containing layer and the forming of the metal-containing layer on the surface comprise:
 providing a metal-containing precursor on the oxygen-containing layer using an atomic layer deposition process to etch the oxygen-containing layer and to continue to selectively form the metal-containing layer on the surface, wherein after etching the oxygen-containing layer, the surface originally covered by the oxygen-containing layer is directly exposed to the metal-containing precursor to form the metal-containing layer on the surface.

* * * * *